US012660418B2

(12) United States Patent
Park et al.

(10) Patent No.: US 12,660,418 B2
(45) Date of Patent: Jun. 16, 2026

(54) DISPLAY APPARATUS HAVING PIXEL AREAS DISPLAYING DIFFERENT COLORS

(71) Applicant: LG DISPLAY CO., LTD., Seoul (KR)

(72) Inventors: Ji Sub Park, Paju-si (KR); Young Chul Shin, Paju-si (KR); Young Cheol Chae, Paju-si (KR); Su Min An, Paju-si (KR); Byeong Gon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 441 days.

(21) Appl. No.: 18/378,478

(22) Filed: Oct. 10, 2023

(65) Prior Publication Data

US 2024/0224586 A1    Jul. 4, 2024

(30) Foreign Application Priority Data

Dec. 30, 2022    (KR) ......................... 10-2022-0191000

(51) Int. Cl.
*H10K 59/121* (2023.01)
*H10K 59/80* (2023.01)
*H10K 102/00* (2023.01)

(52) U.S. Cl.
CPC ..... *H10K 59/121* (2023.02); *H10K 59/80515* (2023.02); *H10K 59/80521* (2023.02); *H10K 2102/351* (2023.02)

(58) Field of Classification Search
CPC ................... H10K 59/80515; H10K 59/80521

USPC .................................................. 313/498–512
See application file for complete search history.

(56) References Cited

U.S. PATENT DOCUMENTS

| | | | | |
|---|---|---|---|---|
| 2012/0012848 A1* | 1/2012 | Suh | ......................... | H10K 71/18 |
| | | | | 438/34 |
| 2013/0057143 A1* | 3/2013 | Sugimoto | ........ | H10K 59/80522 |
| | | | | 313/498 |
| 2013/0099258 A1* | 4/2013 | Lim | ....................... | H10K 50/85 |
| | | | | 257/E51.02 |
| 2016/0126496 A1* | 5/2016 | Wang | ................. | H10K 59/8731 |
| | | | | 257/40 |
| 2022/0123265 A1* | 4/2022 | Na | ....................... | H10K 59/124 |

FOREIGN PATENT DOCUMENTS

| | | | | | |
|---|---|---|---|---|---|
| JP | 2005174717 A | * | 6/2005 | | |
| KR | 20150057739 A | * | 5/2015 | ......... | H10K 59/1201 |
| KR | 10-2015-0078238 A | | 7/2015 | | |

* cited by examiner

*Primary Examiner* — Christopher M Raabe
(74) *Attorney, Agent, or Firm* — Fish & Richardson P.C.

(57) ABSTRACT

A display apparatus includes a red pixel area displaying red color, a green pixel area displaying green color, and a blue pixel area displaying blue color. A light-emitting device may be disposed in each pixel area. The light-emitting device of each pixel area may have a stacked structure of a lower electrode, a light-emitting layer and an upper electrode. An upper surface of the lower electrode in each pixel area may have a curvature different from an upper surface of the lower electrode in the pixel area displaying a different color from the corresponding pixel area. Thus, in the display apparatus, characteristics in a viewing angle can be improved.

15 Claims, 8 Drawing Sheets

DISPLAY APPARATUS HAVING PIXEL AREAS DISPLAYING DIFFERENT COLORS

CROSS-REFERENCE TO RELATED APPLICATION

This application claims the priority of Korean Patent Application No. 10-2022-0191000, filed on Dec. 30, 2022, which is hereby incorporated by reference in its entirety.

BACKGROUND

Field of the Disclosure

The present disclosure relates to a display apparatus in which a pixel area displays a color different from an adjacent pixel area.

Description of the Background

Generally, a display apparatus provides an image to a user. For example, the display apparatus may include a plurality of pixel area. Each of the pixel areas may realize a specific color. For example, a light-emitting device may be disposed in each pixel area. The light-emitting device may emit light displaying a specific color. For example, the light-emitting device may include a lower electrode, a light-emitting layer and an upper electrode, which are sequentially stacked.

Each of the pixel areas may realize a color different from adjacent pixel area. For example, the pixel areas may include a red pixel area realizing red color, a green pixel area realizing green color and a blue pixel area realizing blue color.

The display apparatus may use a micro-cavity effect to improve light-extraction efficiency. For example, light emitted by the light-emitting layer of each pixel area may be amplified by reciprocating between the lower electrode and the upper electrode of the corresponding pixel area. Thus, in the display apparatus, a distance between the lower electrode and the upper electrode in each pixel area may vary according to a color realized in the corresponding pixel area.

However, in the display apparatus, an optical distance of the light emitted from the light-emitting device of each pixel area may vary according to an emission direction of the corresponding light. For example, in the display apparatus, luminance of the light emitted from the light-emitting device of each pixel area may vary according to a viewing angle. And, in the display apparatus, an amount of luminance change according to the viewing angle of the light emitted from the light-emitting device in each pixel area may vary according to a color in which the corresponding light displays. Thus, in the display apparatus, color sense and color coordinates according to the viewing angle may vary greatly.

SUMMARY

Accordingly, the present disclosure is directed to a display apparatus that substantially obviates one or more problems due to limitations and disadvantages of the related art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More particularly, the present disclosure is to provide a display apparatus capable of minimizing changes of color sense according to a viewing angle.

In addition, the present disclosure is to provide a display apparatus capable of reducing deviation in an amount of luminance change according to a viewing angle of light emitted from light-emitting devices of pixel areas realizing different colors.

To achieve these and other advantages and in accordance with the present disclosure, as embodied and broadly described herein, a display apparatus includes a device substrate. The device substrate includes a first pixel area and a second pixel area. The second pixel area realizes a color different from the first pixel area. A planarization layer is disposed on the first pixel area and the second pixel area of the device substrate. A first light-emitting device is disposed on the planarization layer of the first pixel area. The first light-emitting device has a stacked structure of a first lower electrode, a first light-emitting layer and a first upper electrode. A second light-emitting device is disposed on the planarization layer of the second pixel area. The second light-emitting device has a stacked structure of a second lower electrode, a second light-emitting layer and a second upper electrode. An upper surface of the second lower electrode toward the second light-emitting layer has a curvature different from an upper surface of the first lower electrode toward the first light-emitting layer.

The second lower electrode may have a same thickness as the first lower electrode.

A first curved structure may be disposed between the planarization layer and the first lower electrode. The upper surface of the first lower electrode may have a curvature corresponding to an upper surface of the first curved structure toward the first lower electrode. A second curved structure may be disposed between the planarization layer and the second lower electrode. The upper surface of the second lower electrode may have a curvature corresponding to an upper surface of the second curved structure toward the second lower electrode.

Each of the first curved structure and the second curved structure may include a lower surface toward the device substrate. The lower surface of the first curved structure and the lower surface of the second curved structure may be in contact with an upper surface of the planarization layer opposite to the device substrate.

The first curved structure and the second curved structure may include a metal.

The first curved structure and the second curved structure may have a reflectance higher than the first lower electrode and the second lower electrode.

A third light-emitting device may be disposed on the planarization layer. The third light-emitting device may overlap with a third pixel area of the device substrate. The third light-emitting device may have a stacked structure of a third lower electrode, a third light-emitting layer and a third upper electrode. The third pixel area may realize a color different from the first pixel area and the second pixel area. An upper surface of the third lower electrode toward the third light-emitting layer may have a curvature different from the upper surface of the first lower electrode and the upper surface of the second lower electrode.

A lower surface of the third lower electrode toward the device substrate may be in contact with the upper surface of the planarization layer.

In another aspect of the present disclosure, a display device includes a device substrate. The device substrate includes a first pixel area and a second pixel area. The second pixel area realizes a color different from the first pixel area. A first curved structure is disposed on the first pixel area of the device substrate. An upper surface of the first curved structure has a first curvature. A first light-emitting device is disposed on the upper surface of the first curved structure. The first light-emitting device has a stacked structure of a first lower electrode, a first light-emitting layer and a first upper electrode. The first lower electrode, the first light-emitting layer and the first upper electrode have the first curvature. A second curved structure is disposed on the second pixel area of the device substrate. An upper surface of the second curved structure has a second curvature. A second light-emitting device is disposed on the upper surface of the second curved structure. The second light-emitting device has a stacked structure of a second lower electrode, a second light-emitting layer and a second upper electrode. The second lower electrode, the second light-emitting layer and the second upper electrode have the second curvature. The second curvature is different from the first curvature.

The second lower electrode may have a same thickness as the first lower electrode. The second upper electrode may have a same thickness as the first upper electrode.

The first curved structure and the second curved structure may include an insulating material.

The second curved structure may include a same material as the first curved structure.

A first pixel electrode may be disposed between the device substrate and the first curved structure. The first pixel electrode may be electrically connected to the first lower electrode. A second pixel electrode may be disposed between the device substrate and the second curved structure. The second pixel electrode may be electrically connected to the second lower electrode. An upper surface of the second pixel electrode toward the second curved structure may be parallel to an upper surface of the first pixel electrode toward the first curved structure.

The second pixel electrode may include a same material as the first pixel electrode.

The second pixel electrode may have a same thickness as the first pixel electrode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of the present disclosure, illustrate aspect(s) of the present disclosure and together with the description serve to explain the principle of the present disclosure.

In the drawings:

Figure 15:
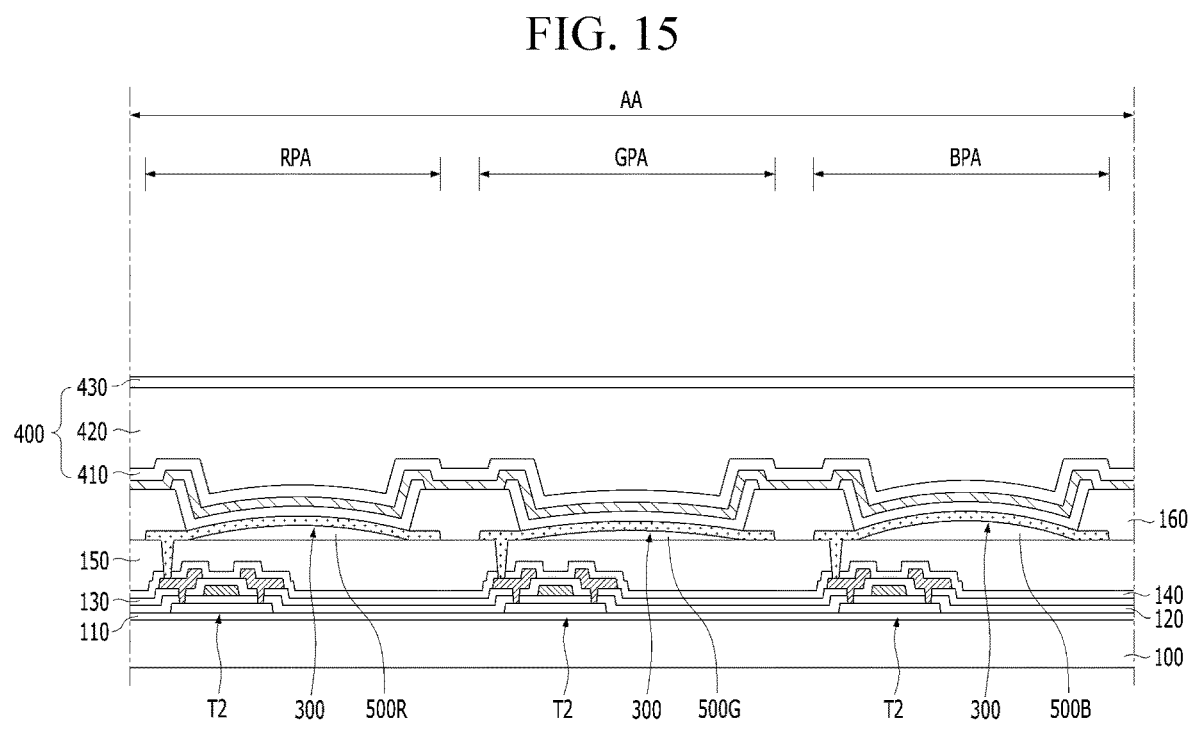

FIGS. 14 and 15 are views showing the display apparatus according to another aspect of the present disclosure.

DETAILED DESCRIPTION

Figure 1:
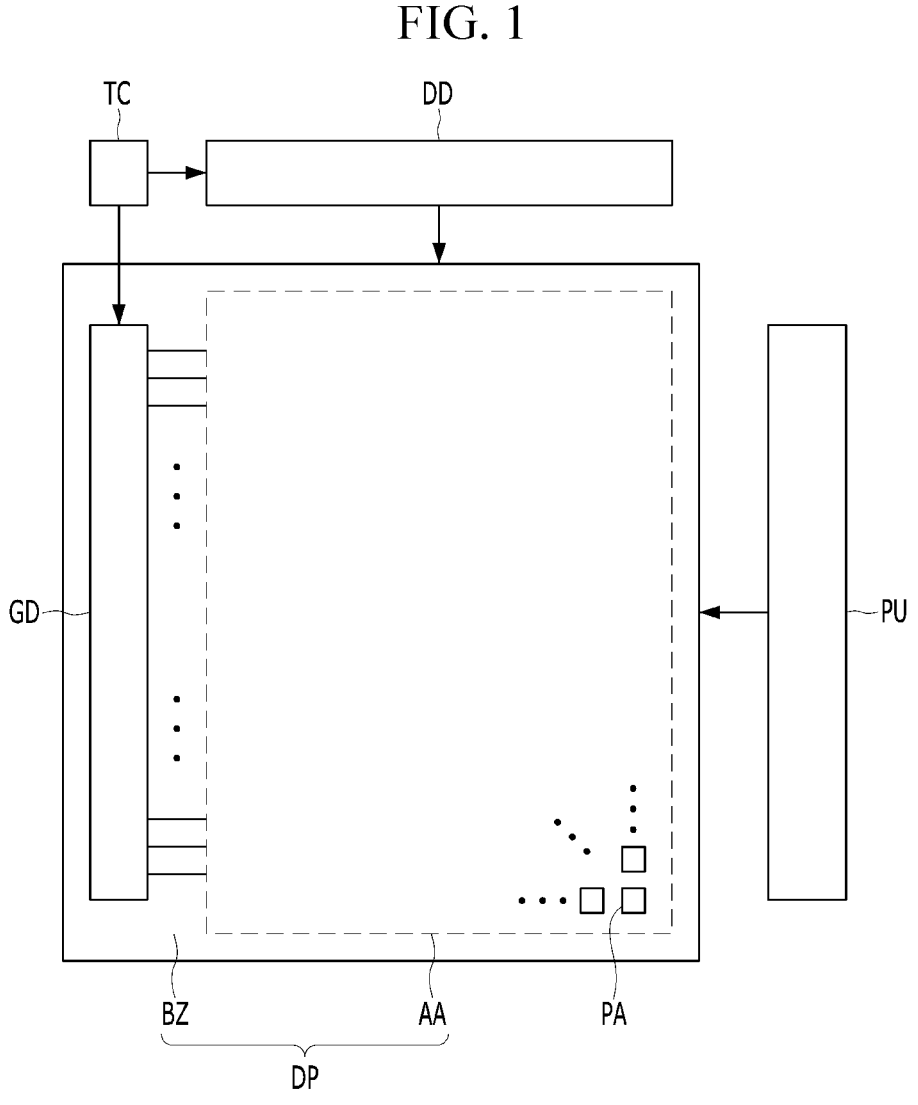
FIG. 1 is a view schematically showing a display apparatus according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a view schematically showing a display apparatus according to an aspect of the present disclosure. FIG.

2 is a view showing a circuit of a unit pixel area in the display apparatus according to the aspect of the present disclosure.

Figure 2:
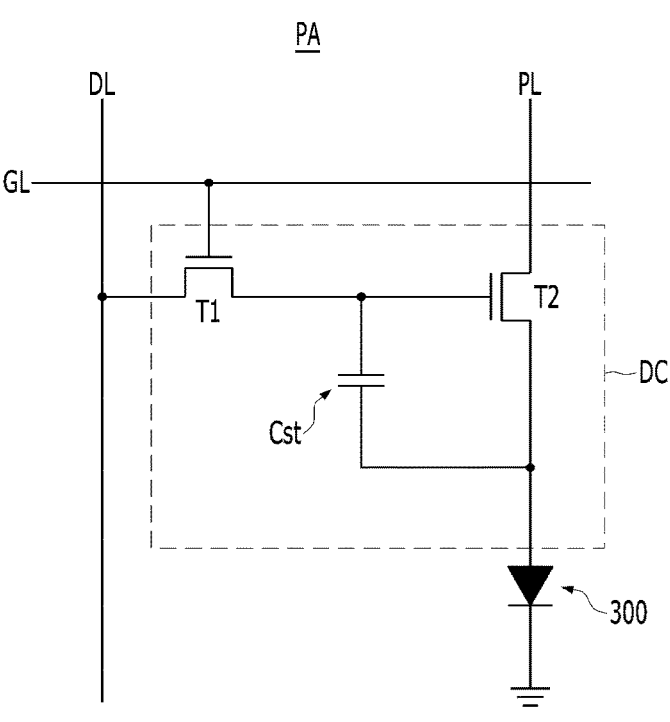
FIG. 2 is a view showing a circuit of a unit pixel area in the display apparatus according to the aspect of the present disclosure.

Referring to FIGS. 1 and 2, the display apparatus according to the aspect of the present disclosure may include a display panel DP. The display panel DP may generate an image provided to a user. For example, the display panel DP may include a plurality of pixel areas PA.

Various signals may be applied to each pixel area PA through signal wirings GL, DL and PL. For example, the signal wirings GL, DL and PL may include gate lines GL applying a gate signal to each pixel area PA, data lines DL applying a data signal to each pixel area PA, and power voltage supply lines PL supplying a power voltage to each pixel area PA. The gate lines GL may be electrically connected to the gate driver GD, and the data lines DL may be electrically connected to the data driver DD. The power voltage supply lines PL may be electrically connected to the power unit PU. The gate driver GD and the data driver DD may be controlled by a timing controller TC. For example, the gate driver GD may receive clock signals, reset signals and a start signal from the timing controller TC, and the data driver DD may receive digital video data and a source timing signal from the timing controller TC.

The display panel DP may include a display area AA in which the pixel areas PA are disposed, and a bezel area BZ disposed outside the display area AA. At least one of the gate driver GD, the data driver DD, the power unit PU and the timing controller TC may be disposed on the bezel area BZ of the display panel DP. For example, the display apparatus according to the aspect of the present disclosure may be a Gate In Panel (GIP) type display apparatus in which the gate driver GD is formed on the bezel area BZ of the display panel DP.

Each of the pixel areas PA may realize a specific color. For example, a pixel driving circuit DC electrically connected to a light-emitting device 300 may be disposed in each pixel area PA. The pixel driving circuit DC of each pixel area PA may supply a driving current corresponding to the data signal to the light-emitting device 300 of the corresponding pixel area PA according to the gate signal. For example, the pixel driving circuit DC of each pixel area PA may include a first thin film transistor T1, a second thin film transistor T2 and a storage capacitor Cst.

Figure 3:
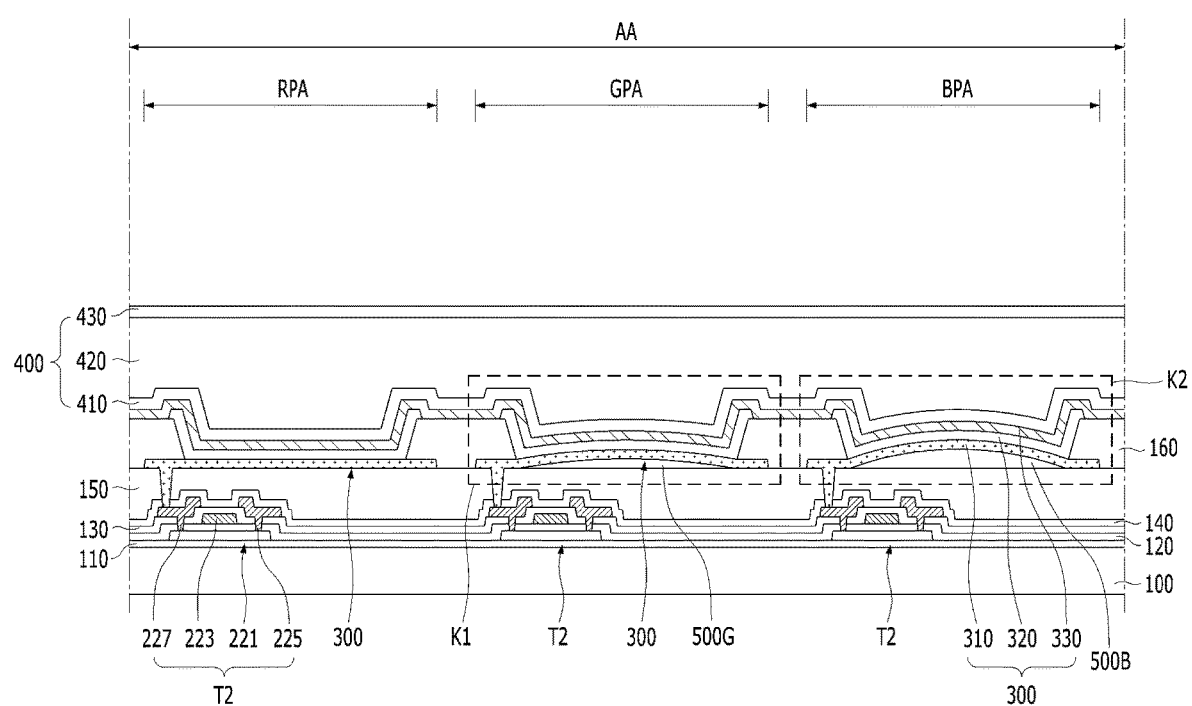
FIG. 3 is a view showing a cross-section of pixel areas realizing different colors in the display apparatus according to the aspect of the present disclosure.
Figure 4:
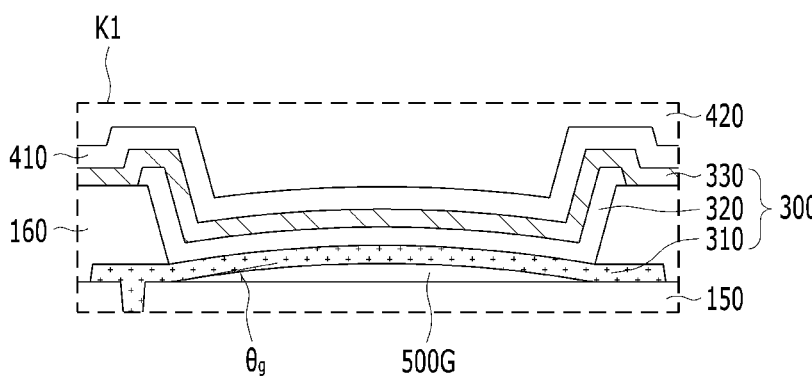
FIG. 4 is an enlarged view of K1 region in FIG. 3.
Figure 5:
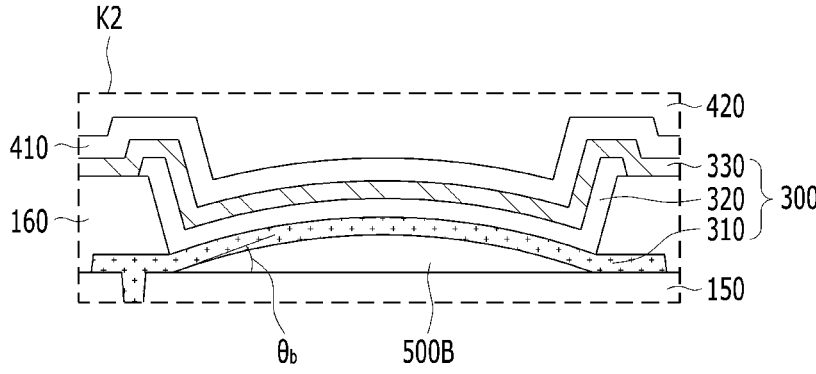
FIG. 5 is an enlarged view of K2 region in FIG. 3.

FIG. 3 is a view showing a cross-section of pixel areas realizing different colors in the display apparatus according to the aspect of the present disclosure. FIG. 4 is an enlarged view of K1 region in FIG. 3. FIG. 5 is an enlarged view of K2 region in FIG. 3.

Referring to FIGS. 2 to 5, the first thin film transistor T1 may include a first semiconductor pattern, a first gate electrode, a first source electrode and a first drain electrode. The first thin film transistor T1 may transmit the data signal to the second thin film transistor T2 according to the gate signal. For example, the first thin film transistor T1 may be a switching thin film transistor. The first gate electrode may be electrically connected to the gate line GL, and the first source electrode may be electrically connected to the data line DL.

The first semiconductor pattern may include a semiconductor material. For example, the first semiconductor pattern 211 may include amorphous silicon (a-Si), polycrystalline silicon (Poly-Si), or an oxide semiconductor, such as IGZO. The first semiconductor pattern may include a first drain region, a first channel region and a first source region. The first channel region may be disposed between the first drain region and the first source region. A resistance of the first drain region and a resistance of the first source region may be smaller than a resistance of the first channel region. For example, the first drain region and the first source region may include a conductorized region of an oxide semiconductor. The first channel region may be a region of an oxide semiconductor, which is not conductorized.

The first gate electrode may include a conductive material. For example, the first gate electrode may include a metal, such as aluminum (Al), chrome (Cr), copper (Cu), molybdenum (Mo), titanium (Ti) and tungsten (W). The first gate electrode may be disposed on the first semiconductor pattern. For example, the first gate electrode may overlap with the first channel region of the first semiconductor pattern. The first drain region and the first source region of the first semiconductor pattern may be disposed outside the first gate electrode. The first gate electrode may be insulated from the first semiconductor pattern. For example, the first source region may be electrically connected to the first drain region according to the gate signal.

The first drain electrode may include a conductive material. For example, the first drain electrode may include a metal, such as aluminum (Al), chrome (Cr), copper (Cu), molybdenum (Mo), titanium (Ti) and tungsten (W). The first drain electrode may include a material different from the first gate electrode. The first drain electrode may be disposed on a layer different from the first gate electrode. The first drain electrode may be electrically connected to the first drain region of the first semiconductor pattern. For example, the first drain electrode may be insulated from the first gate electrode.

The first source electrode may include a conductive material. For example, the first source electrode may include a metal, such as aluminum (Al), chrome (Cr), copper (Cu), molybdenum (Mo), titanium (Ti) and tungsten (W). The first source electrode may include a material different from the first gate electrode. The first source electrode may be disposed on a layer different from the first gate electrode. For example, the first source electrode may be disposed on a same layer as the first drain electrode. The first source electrode may include a same material as the first drain electrode. For example, the first source electrode may be formed simultaneously with the first drain electrode. The first source electrode may be electrically connected to the first source region of the first semiconductor pattern. For example, the first source electrode may be insulated from the first gate electrode.

The second thin film transistor T2 may generate the driving current corresponding to the data signal. For example, the second thin film transistor T2 may be a driving thin film transistor. The second thin film transistor T2 may include a second semiconductor pattern 221, a second gate electrode 223, a second drain electrode 225 and a second source electrode 227. For example, the second gate electrode 223 may be electrically connected to the first source electrode of the first thin film transistor T1, and the second drain electrode 225 may be electrically connected to the power voltage supply line PL. The second thin film transistor T2 may have a same structure as the first thin film transistor T1.

The second semiconductor pattern 221 may include a semiconductor material. For example, the second semiconductor pattern 221 may include amorphous silicon (a-Si), polycrystalline silicon (poly-Si), or an oxide semiconductor, such as IGZO. The second semiconductor pattern 221 may include a second channel region between a second drain region and a second source region. The second drain region and the second source region may have a resistance smaller than the second channel region. For example, the second drain region and the second source region may include a conductorized region of an oxide semiconductor, and the second channel region may be a region of an oxide semiconductor, which is not conductorized.

The second semiconductor pattern 221 may include a same material as the first semiconductor pattern. For example, the second semiconductor pattern 221 may be formed simultaneously with the first semiconductor pattern. The second semiconductor pattern 221 may be disposed on a same layer as the first semiconductor pattern. The second drain region and the second source region of the second semiconductor pattern 221 may have a same resistance as the first drain region and the first source region of the first semiconductor pattern. For example, the second channel region of the second semiconductor pattern 221 may have a same resistance as the first channel region of the first semiconductor pattern.

The second gate electrode 223 may include a conductive material. For example, the second gate electrode 213 may include a metal, such as aluminum (Al), chrome (Cr), copper (Cu), molybdenum (Mo), titanium (Ti) and tungsten (W). The second gate electrode 223 may be disposed on a same material as the first gate electrode. For example, the second gate electrode 223 may be formed simultaneously with the first gate electrode. The second gate electrode 223 may be disposed on a same layer as the first gate electrode.

The second gate electrode 223 may be disposed on the second semiconductor pattern 221. For example, the second gate electrode 223 may overlap with the second channel region of the second semiconductor pattern 221. The second drain region and the second source region of the second semiconductor pattern 221 may be disposed outside the second gate electrode 223. The second gate electrode 223 may be insulated from the second semiconductor pattern 221. For example, the second channel region of the second semiconductor pattern 221 may have an electrical conductivity corresponding to a voltage applied to the second gate electrode 223.

The second drain electrode 225 may include a conductive material. For example, the second drain electrode 225 may include a metal, such as aluminum (Al), chrome (Cr), copper (Cu), molybdenum (Mo), titanium (Ti) and tungsten (W). The second drain electrode 225 may include a material different from the second gate electrode 223. The second drain electrode 225 may be disposed on a layer different from the second gate electrode 223. For example, the second drain electrode 225 may be insulated from the second gate electrode 223. The second drain electrode 225 may be electrically connected to the second drain region of the second semiconductor pattern 221.

The second drain electrode 225 may include a same material as the first drain electrode. The second drain electrode 225 may be disposed on a same layer as the first drain electrode. For example, the second drain electrode 225 may be formed simultaneously with the first drain electrode. Thus, in the display apparatus according to the aspect of the present disclosure, process efficiency may be improved.

The second source electrode 227 may include a conductive material. For example, the second source electrode 227 may include a metal, such as aluminum (Al), chrome (Cr), copper (Cu), molybdenum (Mo), titanium (Ti) and tungsten (W). The second source electrode 227 may include a material different from the second gate electrode 223. The second source electrode 227 may be disposed on a layer different from the second gate electrode 223. For example, the second source electrode 227 may be insulated from the second gate electrode 223. The second source electrode 227 may be electrically connected to the second source region of the second semiconductor pattern 221.

The second source electrode 227 may be disposed on a same layer as the first source electrode. The second source electrode 227 may include a same material as the first source electrode. For example, the second source electrode 227 may be formed simultaneously with the first source electrode. Thus, in the display apparatus according to the aspect of the present disclosure, process efficiency may be improved.

The storage capacitor Cst may maintain a signal applied to the second gate electrode 223 of the second thin film transistor T2 for one frame. For example, the storage capacitor Cst may be electrically connected between the second gate electrode 223 and the second source electrode 227 of the second thin film transistor T2. The storage capacitor Cst may have a stacked structure of capacitor electrodes. The storage capacitor Cst may be formed using a process of forming the first thin film transistor T1 and the second thin film transistor T2. For example, the storage capacitor Cst may include a first capacitor electrode disposed on a same layer as the second gate electrode 223 and a second capacitor electrode disposed on a same layer as the second source electrode 227.

The pixel driving circuit DC of each pixel area PA may be disposed on a device substrate 100. The device substrate 100 may include an insulating material. For example, the device substrate 100 may include glass or plastic.

A plurality of insulating layers 110, 120, 130, 140, 150 and 160 for preventing unnecessary electrical connection in each pixel area PA may be disposed on the device substrate 100. For example, a device buffer layer 110, a gate insulating layer 120, an interlayer insulating layer 130, a device passivation layer 140, a planarization layer 150 and a bank insulating layer 160 may be disposed on the device substrate 100.

The device buffer layer 110 may be disposed close to the device substrate 100. The device buffer layer 110 may prevent pollution due to the device substrate 100 in a process of forming the pixel driving circuit DC of each pixel area PA. For example, a surface of the device substrate 100 may be completely covered by the device buffer layer 110. The pixel driving circuit DC of each pixel area PA may be disposed on the device buffer layer 110. The device buffer layer 110 may include an insulating material. For example, the device buffer layer 110 may include an inorganic insulating material, such as silicon oxide (SiOx) and silicon nitride (SiNx). The device buffer layer 110 may include a multi-layer structure. For example, the device buffer layer 110 may have a stacked structure of an inorganic insulating layer made of silicon oxide (SiOx) and an inorganic insulating layer made of silicon nitride (SiNx).

The gate insulating layer 120 may insulate the gate electrodes 223 of each pixel area PA from the corresponding semiconductor pattern 221. For example, the first semiconductor pattern and the second semiconductor pattern 221 of each pixel area PA may be covered by the gate insulating layer 120. The first gate electrode and the second gate electrode 223 of each pixel area PA may be disposed on the gate insulating layer 120. The gate insulating layer 120 may include an insulating material. For example, the gate insulating layer 120 may include an inorganic insulating material, such as silicon oxide (SiOx).

The interlayer insulating layer 130 may insulate the drain electrodes 225 and the source electrodes 227 of each pixel area PA from the corresponding gate electrode 223. For example, the first gate electrode and the second gate electrode 223 of each pixel area PA may be covered by the interlayer insulating layer 130. The first drain electrode, the first source electrode, the second drain electrode 225 and the second source electrode 227 of each pixel area PA may be disposed on the interlayer insulating layer 130. The interlayer insulating layer 130 may include an insulating material. For example, the interlayer insulating layer 130 may include an inorganic insulating material, such as silicon oxide (SiOx) and silicon nitride (SiNx). The interlayer insulating layer 130 may include a multi-layer structure. For example, the interlayer insulating layer 130 may have a stacked structure of an inorganic insulating layer made of silicon oxide (SiOx) and an inorganic insulating layer made of silicon nitride (SiNx).

The device passivation layer 140 may be disposed on the interlayer insulating layer 130. The device passivation layer 140 may prevent damages of the pixel driving circuit DC in each pixel area PA due to external moisture and impact. For example, the first drain electrode, the first source electrode, the second drain electrode 225 and the second source electrode 227 of each pixel area PA may be covered by the device passivation layer 140. The device passivation layer 140 may include an insulating material. For example, the device passivation layer 140 may be an inorganic insulating material, such as silicon oxide (SiOx) and silicon nitride (SiNx).

The planarization layer 150 may be disposed on the device passivation layer 140. The planarization layer 150 may remove a thickness difference due to the pixel driving circuit DC of each pixel area PA. For example, an upper surface of the planarization layer 150 opposite to the device substrate 100 may be a flat surface. The planarization layer 150 may include an insulating material. The planarization layer 150 may include a material different from the device passivation layer 140. For example, the planarization layer 150 may be an organic insulating material.

A light-emitting device 300 of each pixel area PA may emit light displaying a specific color. For example, the light-emitting device 300 of each pixel area PA may have a stacked structure of a lower electrode 310, a light-emitting layer 320 and an upper electrode 330. The light-emitting device 300 of each pixel area PA may be disposed on the planarization layer 150 of the corresponding pixel area PA. For example, the lower electrode 310 may be disposed on the planarization layer 150, the light-emitting layer 320 may be disposed on an upper surface of the lower electrode 310 opposite to the device substrate 100, and the upper electrode 330 may be disposed on an upper surface of the light-emitting layer 320 opposite to the device substrate 100.

The lower electrode 310 may include a conductive material. The lower electrode 310 may have a relatively high reflectance. For example, the lower electrode 310 may include a metal, such as aluminum (Al) and silver (Ag). The lower electrode 310 may have a multi-layer structure. For example, the lower electrode 310 may have a structure in which a reflective electrode made of a metal is disposed between transparent electrodes made of a transparent conductive material, such as ITO and IZO.

The light-emitting layer 320 may generate light having luminance corresponding to a voltage difference between the lower electrode 310 and the upper electrode 330. For example, the light-emitting layer 320 may include an emission material layer (EML) having an emission material. The emission material may include an organic material, an inorganic material or a hybrid material. For example, the display apparatus according to the aspect of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the aspect of the present disclosure, the emission efficiency of the light-emitting layer 320 may be improved.

The upper electrode 330 may include a conductive material. The upper electrode 330 may include a material different from the lower electrode 310. A transmittance of the upper electrode 330 may be higher than a transmittance of the lower electrode 310. For example, the upper electrode 330 may be a translucent electrode in which metals such as Ag and Mg are thinly formed. Thus, in the display apparatus according to the aspect of the present disclosure, the light generated by the light-emitting layer 320 may be reciprocated between the lower electrode 310 and the upper electrode 330. That is, in the display apparatus according to the aspect of the present disclosure, the light generated by the light-emitting layer 320 of each pixel area PA may be amplified by the micro-cavity effect. The light amplified by the micro-cavity effect may be emitted outside through the upper electrode 330. Therefore, in the display apparatus according to the aspect of the present disclosure, light-extraction efficiency may be improved.

The light-emitting device 300 of each pixel area PA may be electrically connected to the second thin film transistor T2 of the pixel driving circuit DC in the corresponding pixel area PA. For example, the second source electrode 227 of each pixel area PA may be electrically connected to the lower electrode 310 of the corresponding pixel area PA. The device passivation layer 140 and the planarization layer 150 may include electrode contact holes partially exposing the second source electrode 227 of each pixel area PA. The lower electrode 310 of each pixel area PA may be in direct contact with the second source electrode 227 of the corresponding pixel area PA through one of the electrode contact holes.

The bank insulating layer 160 may be disposed on the planarization layer 150. The bank insulating layer 160 may define an emission area in each pixel area PA. For example, the bank insulating layer 160 may cover an edge of the lower electrode 310 in each pixel area PA. The light-emitting layer 320 and the upper electrode 330 of each pixel area PA may be sequentially stacked on a portion of the corresponding lower electrode 310 exposed by the bank insulating layer 160. The bank insulating layer 160 may include an insulating material. For example, the bank insulating layer 160 may be an organic insulating layer including an organic insulating material. The bank insulating layer 160 may include a material different from the planarization layer 150. The lower electrode 310 of each pixel area PA may be insulated from the lower electrode 310 of adjacent pixel area PA by the bank insulating layer 160.

A voltage applied to the upper electrode 330 of each pixel area PA may be a same as a voltage applied to the upper electrode 330 of adjacent pixel area PA. For example, the upper electrode 330 of each pixel area PA may be electrically connected to the upper electrode 330 of adjacent pixel area PA. The upper electrode 330 of each pixel area PA may include a same material as the upper electrode 330 of adjacent pixel area PA. For example, the upper electrode 330 of each pixel area PA may be formed simultaneously with the upper electrode 330 of adjacent pixel area PA. The upper electrode 330 of each pixel area PA may be in direct contact with the upper electrode 330 of adjacent pixel area PA. For example, the upper electrode 330 of each pixel PA may extend onto the bank insulating layer 160. The bank insulating layer 160 may be covered by the upper electrode 160. Thus, in the display apparatus according to the aspect of the present disclosure, a process of forming the upper electrode 330 in each pixel area PA may be simplified. And, in the display apparatus according to the aspect of the present disclosure, the luminance of the light emitted from the light-emitting device 300 of each pixel area PA may be adjusted by the data signal applied to the pixel driving circuit DC of the corresponding pixel area PA.

An encapsulation unit 400 may be disposed on the light-emitting device 300 of each pixel area PA. The encapsulation unit 400 may prevent damages of the light-emitting devices 300 due to the external moisture and impact. The encapsulation unit 400 may have a multi-layer structure. For example, the encapsulation unit 400 may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may be an inorganic insulating layer made of silicon nitride (SiNx) or silicon oxide (SiOx), and the second encapsulating layer 420 may an organic insulating layer made of an organic insulating material. Thus, in the display apparatus according to the aspect of the present disclosure, the damages of the light-emitting devices 300 due to the external moisture and impact may be effectively prevented.

The pixel areas PA in the display area AA may realize various colors. For example, the pixel areas PA may include a red pixel area RPA realizing red color, a green pixel area GPA realizing green color and a blue pixel area BPA realizing blue color. The light-emitting layer 320 of each pixel area PA may be spaced apart from the light-emitting layer 320 of adjacent pixel area PA. For example, the light-emitting layer 320 of each pixel area PA may include an end on the bank insulating layer 160. A distance between the lower electrode 310 and the upper electrode 330 in each pixel area PA may vary according to a color realized by the corresponding pixel area PA for micro-cavity effect. For example, a distance between the lower electrode 310 and the upper electrode 330 in the green pixel area GPA may be different from a distance between the lower electrode 310 and the upper electrode 330 in the red pixel area RPA and a distance between the lower electrode 310 and the upper electrode 330 in the blue pixel area BPA. A thickness of the light-emitting layer 320 in the green pixel area GPA may be different from a thickness of the light-emitting layer 320 in the red pixel area RPA and a thickness of the light-emitting layer 320 in the blue pixel area BPA.

The lower electrode 310 of each pixel area PA may have a curvature different from the lower electrode 310 of the pixel area PA realizing a color different from the corresponding pixel area PA. For example, in the display apparatus according to the aspect of the present disclosure, a green curved structure 500G may be disposed between the planarization layer 150 and the lower electrode 310 of the green pixel area GPA, and a blue curved structure 500B may be disposed between the planarization layer 150 and the lower electrode 310 of the blue pixel area BPA. A lower surface of the lower electrode 310 in the red pixel area RPA may be in direct contact with the upper surface of the planarization layer 150.

A lower surface of the green curved structure 500G toward the device substrate 100 may be in direct contact with the planarization layer 150. An upper surface of the green curved structure 500G opposite to the device substrate 100 may have a first curvature. For example, a cross-section of the green curved structure 500G may be a semi-circular shape. The lower electrode 310, the light-emitting layer 320 and the upper electrode 330 of the light-emitting device 300 in the green pixel area GPA may be sequentially stacked on the upper surface of the green curved structure 500G. The lower electrode 310, the light-emitting layer 320 and the upper electrode 330 of the light-emitting device 300 in the green pixel area GPA may have a same curvature as the upper surface of the green curved structure 500G. For example, the lower electrode 310, the light-emitting layer 320 and the upper electrode 330 of the light-emitting device 300 in the green pixel area GPA may have the first curvature.

A lower surface of the blue curved structure 500B toward the device substrate 100 may be in direct contact with the planarization layer 150. An upper surface of the blue curved structure 500B opposite to the device substrate 100 may have a second curvature. For example, a cross-section of the blue curved structure 500B may be a semi-circular shape. The lower electrode 310, the light-emitting layer 320 and the upper electrode 330 of the light-emitting device 300 in the blue pixel area BPA may be sequentially stacked on the upper surface of the blue curved structure 500B. The lower electrode 310, the light-emitting layer 320 and the upper electrode 330 of the light-emitting device 300 in the blue pixel area BPA may have a same curvature as the upper surface of the blue curved structure 500B. For example, the lower electrode 310, the light-emitting layer 320 and the upper electrode 330 of the light-emitting device 300 in the blue pixel area BPA may have the second curvature.

The second curvature may be different from the first curvature. For example, a maximum thickness of the blue curved structure 500B may be different from a maximum thickness of the green curved structure 500G. The inclined angle $\theta b$ of an edge of the blue curved structure 500B based on the upper surface of the planarization layer 150 may be different from the inclined angle $\theta g$ of an edge of the green curved structure 500G based on the upper surface of the planarization layer 150. For example, the inclined angle $\theta b$ of an edge of the blue curved structure 500B may be greater than the inclined angle $\theta g$ of an edge of the green curved structure 500G. The second curvature may be greater than the first curvature.

Figure 6:
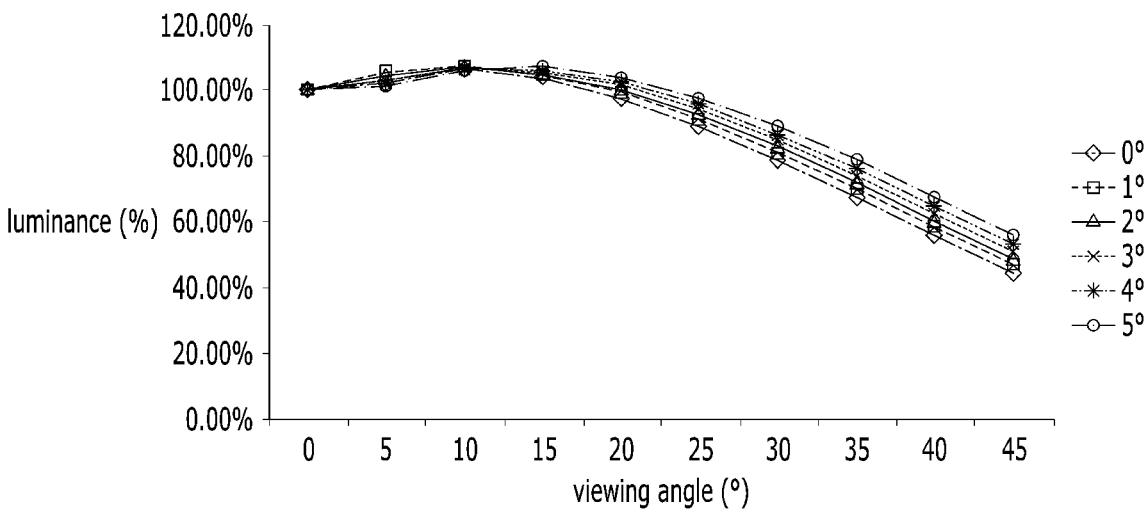
FIGS. 6 to 8 are graphs showing decrease in luminance depending on a viewing angle of light displaying red color, green color or blue color according to an inclined angle of a lower electrode.
Figure 7:
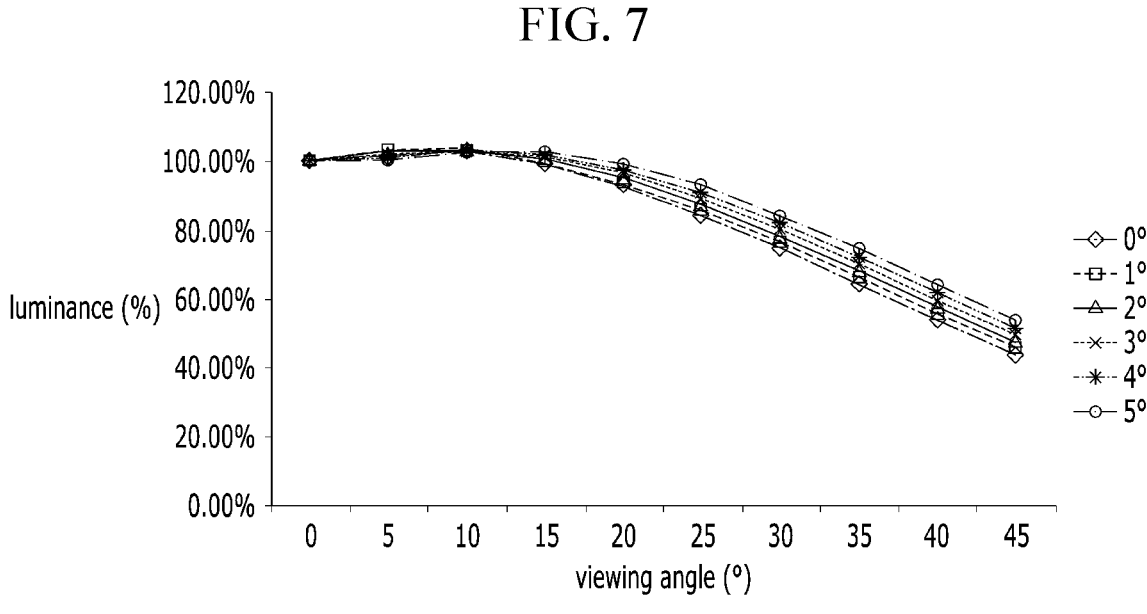
Figure 8:
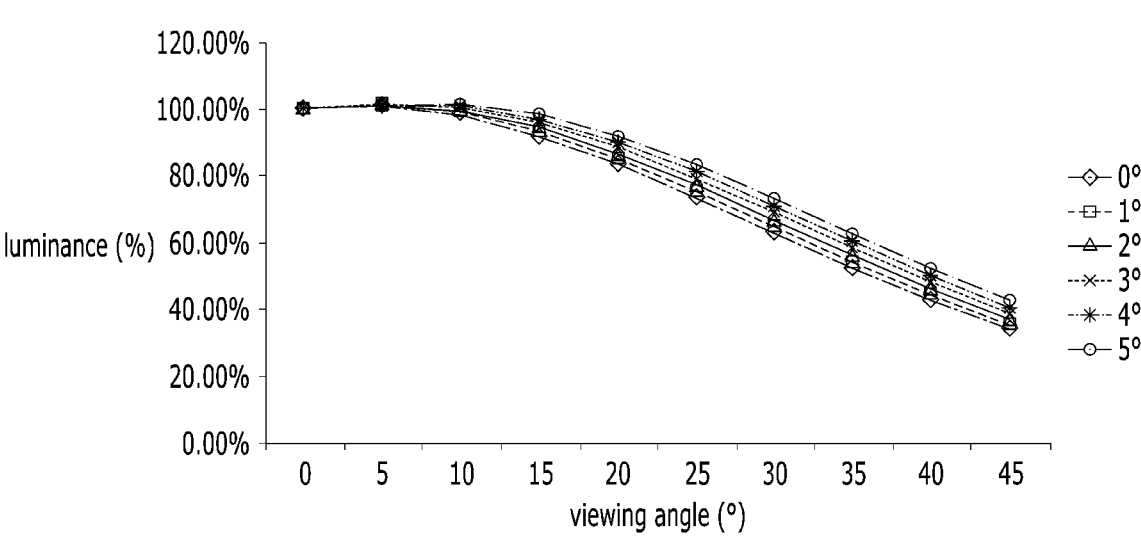

FIG. 6 is a graph showing decrease in luminance depending on a viewing angle of light displaying red color according to an inclined angle of the lower electrode 310. FIG. 7 is a graph showing decrease in luminance depending on a viewing angle of light displaying green color according to an inclined angle of the lower electrode 310. FIG. 8 is a graph showing decrease in luminance depending on a viewing angle of light displaying blue color according to an inclined angle of the lower electrode 310.

Referring to FIGS. 3 and 6 to 8, when the lower electrode 310 has a same inclined angle, an amount of luminance change according to a viewing angle of the light emitted from the light-emitting device 300 of the red pixel area RPA, the light emitted from the light-emitting device 300 of the green pixel area GPA, and the light emitted from the light-emitting device 300 of the blue pixel area BPA. For example, when the inclined angle of the edge of the lower electrode 310 is 0°, the light emitted from the light-emitting device 300 in the red pixel area RPA may have luminance of 44. 54% compared to the front, the light emitted from the light-emitting device 300 in the green pixel area GPA may have luminance of 43. 66% compared to the front, and the light emitted from the light-emitting device 300 in the blue pixel area BPA may have luminance of 33. 83% compared to the front, at a viewing angle of 45°. That is, in the display apparatus according to the aspect of the present disclosure, when the lower electrode 310 of the red pixel area RPA, the lower electrode 310 of the green pixel area GPA and the lower electrode 310 of the blue pixel area BPA are in contact with the upper surface of the planarization layer 150, luminance of blue color may be significantly lower than luminance of red color and luminance of green color, at a viewing angle of 45°.

And, referring to FIGS. 3 and 6 to 8, the amount of luminance degradation according to the viewing angle of the light emitted from the light-emitting device 300 in each of the pixel areas RPA, GPA, and BPA may decrease as the curvature of the lower electrode 310 increases. For example, when the inclined angle of the edge of the lower electrode 310 is 5°, the light emitted from the light-emitting device 300 in the blue pixel area BPA may have luminance of 42. 40% compared to the front, at a viewing angle of 45°. When the inclined angle of the edge of the lower electrode 310 is 1°, the light emitted from the light-emitting device 300 in the green pixel area GPA may have luminance of 45. 58% compared to the front, at a viewing angle of 45°. That is, in the display apparatus according to the aspect of the present disclosure, when the lower electrode 310 of the red pixel area RPA is in contact with the upper surface of the planarization layer 150, an angle between the edge of the lower electrode 310 of the green pixel area GPA and the upper surface of the planarization layer 150 is 1° by the green curved structure 500G, and an angle between the edge of the lower electrode 310 of the blue pixel area BPA and the upper surface of the planarization layer 150 is 5°, deviation in luminance of red color, green color and blue color may be greatly reduced, at a viewing angle of 45°.

Accordingly, the display apparatus according to the aspect of the present disclosure may include the light-emitting device 300 on each pixel area PA, wherein the light-emitting device 300 may have a stacked structure of the lower electrode 310, the light-emitting layer 320 and the upper electrode 330, wherein the lower electrode 310 of the pixel areas RPA, GPA and BPA realizing different colors may have different curvatures from each other. Thus, in the display apparatus according to the aspect of the present disclosure, the deviation in an amount of luminance change according to the viewing angle may be reduced. For example, in the display apparatus according to the aspect of the present disclosure, the lower electrode 310 of the green pixel area GPA may have a curvature greater than the lower electrode 310 of the red pixel area RPA, and the lower electrode 310 of the blue pixel area BPA may have a curvature greater than the lower electrode 310 of the green pixel area GPA. Therefore, in the display apparatus according to the aspect of the present disclosure, change in color sense according to the viewing angle may be minimized. And, in the display apparatus according to the aspect of the present disclosure, deterioration in the quality of the image according to the viewing angle may be minimized.

The green curved structure 500G and the blue curved structure 500B may have the same shape in a first direction and a second direction. The second direction may be a direction perpendicular to the first direction. For example, the green curved structure 500G and the blue curved structure 500B may have a hemispherical shape. Thus, in the display apparatus according to the aspect of the present disclosure, asymmetry of the image according to an azimuth may be improved.

The green curved structure 500G and the blue curved structure 500B may include an insulating material. The blue curved structure 500B may include a same material as the green curved structure 500G. For example, the blue curved structure 500B may be formed simultaneously with the green curved structure 500G.

FIGS. 9 to 13 are views sequentially showing a method of forming the display apparatus according to the aspect of the present disclosure.

Figure 9:
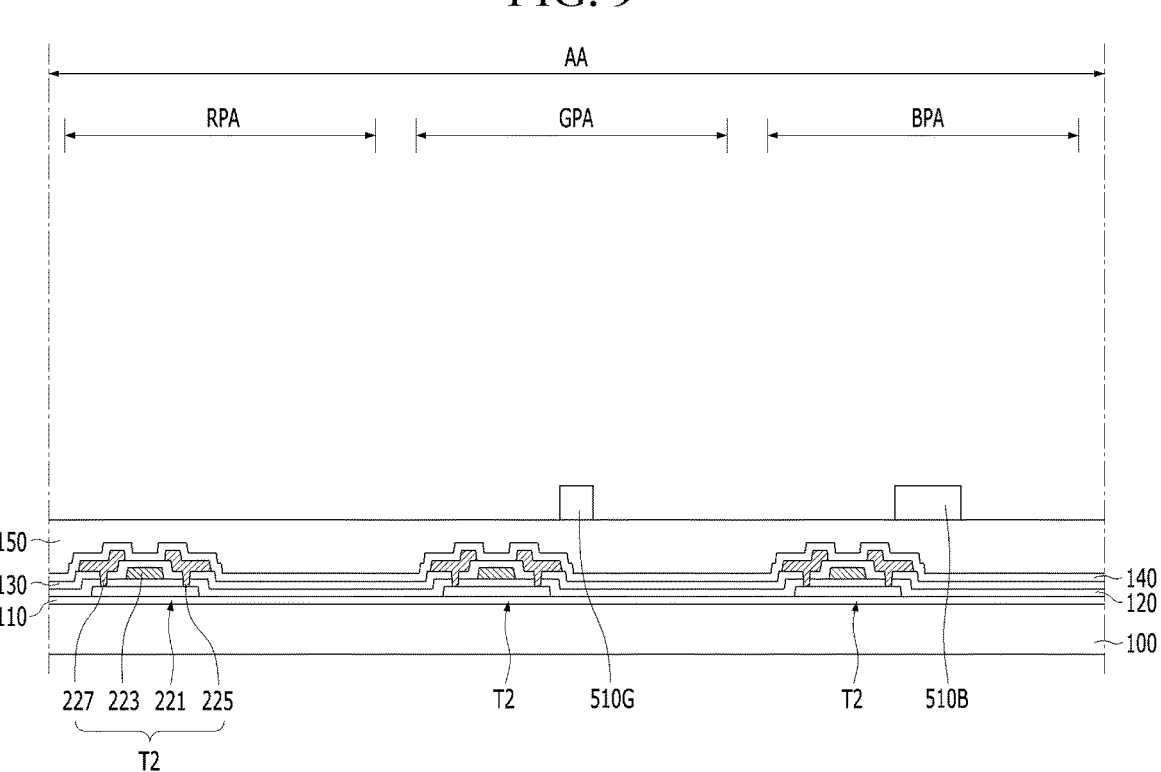
FIGS. 9 to 13 are views sequentially showing a method of forming the display apparatus according to the aspect of the present disclosure.

The method of forming the display apparatus according to the aspect of the present disclosure will be described with reference to FIGS. 3 and 9 to 13. First, the method of forming the display apparatus according to the aspect of the present disclosure may include a step of forming a device buffer layer 110 of a device substrate 100, a step of forming a pixel driving circuit including a second thin film transistor T2, a gate insulating layer 120 and an interlayer insulating layer 130 on each pixel area RPA, GPA and BPA of the device buffer layer 110, a step of forming a device passivation layer 140 on the pixel driving circuit of each pixel area PA, a step of forming a planarization layer 150 on the device passivation layer 140, a step of forming a green preliminary pattern 510G on the planarization layer 150 of a green pixel area GPA, and a step of forming a blue preliminary pattern 510B on the planarization layer 150 of a blue pixel area BPA, as shown in FIG. 9.

The blue preliminary pattern 510B may be formed to have a shape different from the green preliminary pattern 510G. For example, a horizontal width of the blue preliminary pattern 510B may be larger than a horizontal width of the green preliminary pattern 510G. The blue preliminary pattern 510B may be formed of a same material as the green preliminary pattern 510G. The blue preliminary pattern 510B may be formed simultaneously with the green preliminary pattern 510G. For example, the step of forming the green preliminary pattern 510G and the blue preliminary pattern 510B may include a step of forming an insulating layer made of an insulating material on the planarization layer 150 and a step of patterning the insulating layer. A thickness of the blue preliminary pattern 510B may be the same as a thickness of the green preliminary pattern 510G.

Figure 10:
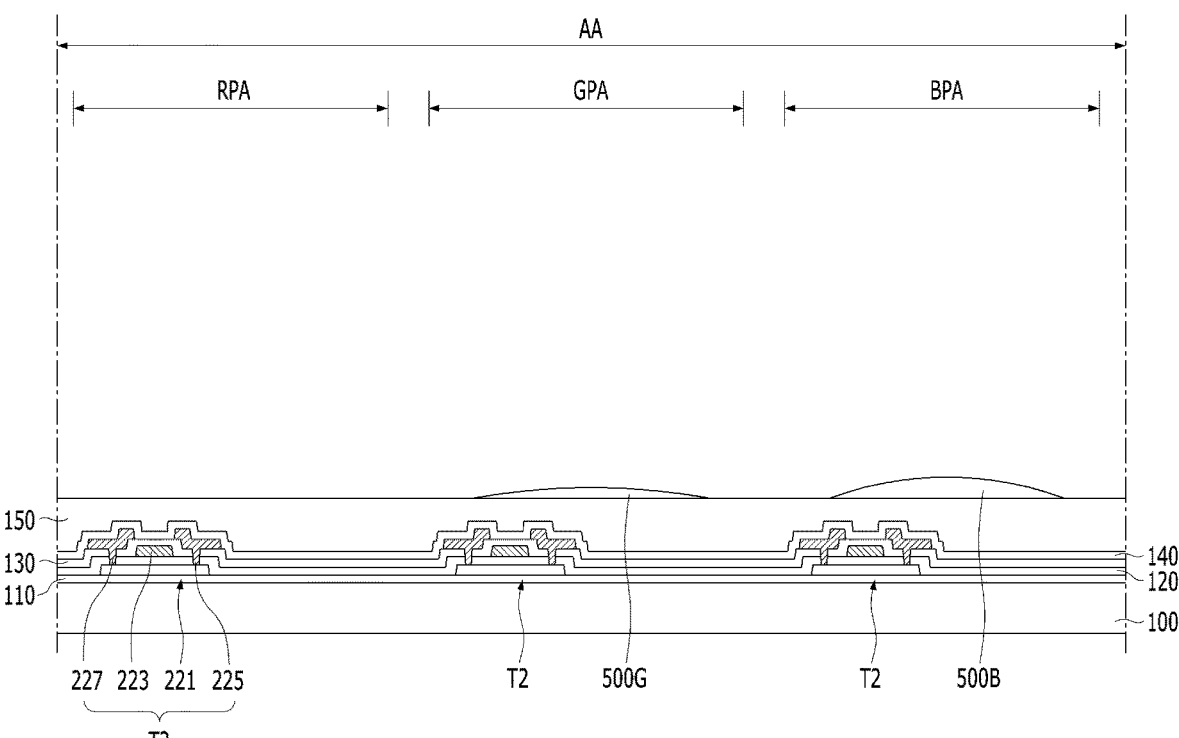

The method of forming the display apparatus according to the aspect of the present disclosure may include a step of forming a green curved structure 500G on the planarization layer 150 of the green pixel area GPA and a step of forming a blue curved structure 500B on the planarization layer 150 of the blue pixel area BPA, as shown in FIG. 10.

The green curved structure 500G may be formed using the green preliminary pattern 510G. The blue curved structure 500B may be formed using the blue preliminary pattern 510B. For example, the blue curved structure 500B may be formed to have a size larger than the green curved structure 500G. The blue curved structure 500B may be formed simultaneously with the green curved structure 500G. For example, the step of forming the green curved structure 500G and the blue curved structure 500B may include a step of reflowing the green preliminary pattern 510G and the blue preliminary pattern 510B. Thus, in the method of forming the display apparatus according to the aspect of the present disclosure, a process of forming the green curved structure 500G and the blue curved structure 500B may be simplified.

Therefore, in the method of forming the display apparatus according to the aspect of the present disclosure, process efficiency may be improved.

The green curved structure 500G and the blue curved structure 500B may have a cross-section of semi-circular shape. An upper surface of the blue curved structure 500B may have a curvature different from an upper surface of the green curved structure 500G. For example, the upper surface of the green curved structure 500G may have a first curvature, and the upper surface of the blue curved structure 500B may have a second curvature. The second curvature may be greater than the first curvature. For example, a maximum thickness of the blue curved structure 500B may have a larger than a maximum thickness of the green curved structure 500G. A lower surface of the green curved structure 500G and a lower surface of the blue curved structure 500B may be in direct contact with an upper surface of the planarization layer 150.

The step of reflowing the green preliminary pattern 510G and the blue preliminary pattern 510B may include a step of heating the green preliminary pattern 510G and the blue preliminary pattern 510B. For example, a process of forming the green curved structure 500G and the blue curved structure 500B may include a thermal reflow process. The green preliminary pattern 510G and the blue preliminary pattern 510B may include a material capable to low-temperature heat treatment. For example, the green preliminary pattern 510G and the blue preliminary pattern 510B may be formed of a photoresist including polyisoprene. Thus, in the method of forming the display apparatus according to the aspect of the present disclosure, a process of forming the green curved structure 500G and the blue curved structure 500B may be performed at a relatively low temperature. For example, in the method of forming the display apparatus according to the aspect of the present disclosure, a process of forming the green curved structure 500G and the blue curved structure 500B may be performed at less than 20° C. Therefore, in the method of forming the display apparatus according to the aspect of the present disclosure, change in characteristics of the pixel driving circuit in each pixel area RPA, GPA and BPA due to a process of forming the green curved structure 500G and the blue curved structure 500B may be prevented.

Figure 11:
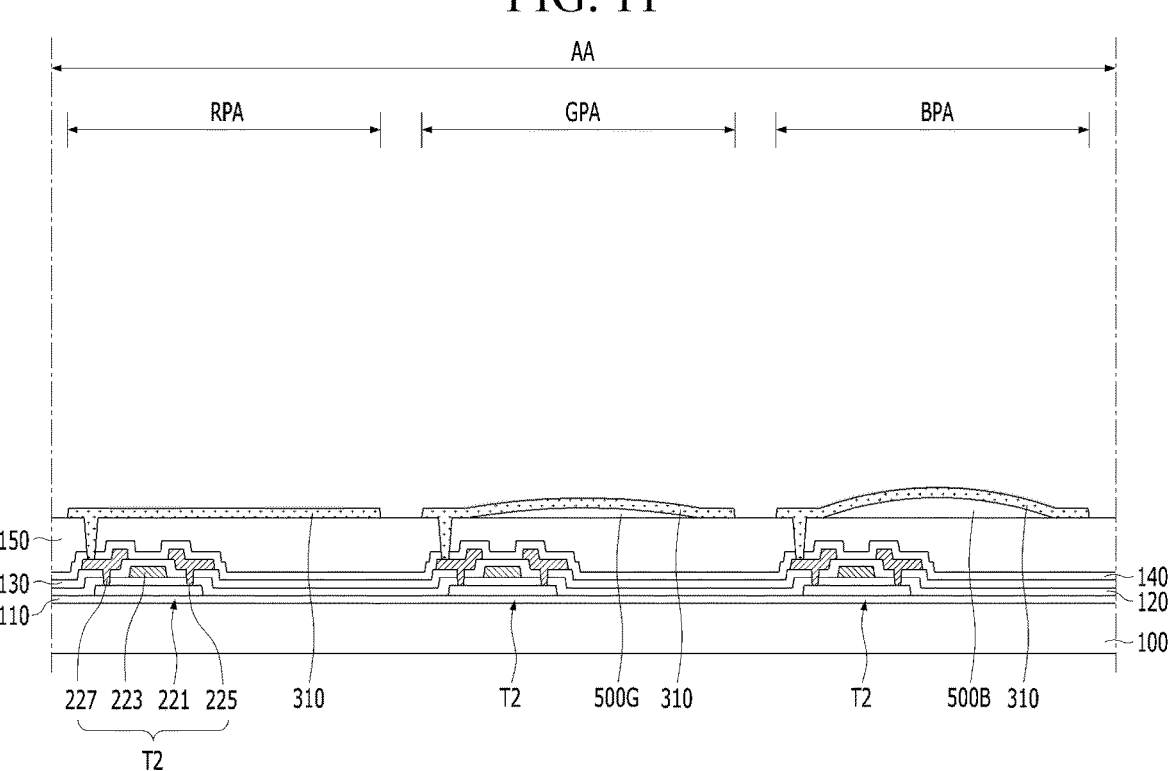

The method of forming the display apparatus according to the aspect of the present disclosure may include a step of forming lower electrodes 310 on the planarization layer 150 of the red pixel area RPA, the green curved structure 500G of the green pixel area GPA and the blue curved structure 500B of the blue pixel area BPA, as shown in FIG. 11.

The lower electrode 310 of the red pixel area RPA may be formed of a same material as the lower electrode 310 of the green pixel area GPA and the lower electrode 310 of the blue pixel area BPA. The lower electrode 310 of the red pixel area RPA may be formed simultaneously with the lower electrode 310 of the green pixel area GPA and the lower electrode 310 of the blue pixel area BPA. For example, a step of forming the lower electrode 310 of the red pixel area RPA, the lower electrode 310 of the green pixel area GPA and the lower electrode 310 of the blue pixel area BPA may include a step of forming a conductive material layer on the substrate 100 in which the green curved structure 500G and the blue curved structure 500B are formed, and a step of patterning the conductive material layer. The lower electrode 310 of the red pixel area RPA may be formed to have a same thickness as the lower electrode 310 of the green pixel area GPA and the lower electrode 310 of the blue pixel area BPA.

The lower electrode 310 of the red pixel area RPA may be in direct contact with the upper surface of the planarization layer 150. For example, a lower surface and an upper surface of the lower electrode 310 formed on the red pixel area RPA may be parallel to the upper surface of the planarization layer 150. The lower electrode 310 of the green pixel area GPA may be in direct contact with the upper surface of the green curved structure 500G. A lower surface and an upper surface of the lower electrode 310 formed on the green pixel area GPA may have a curvature corresponding to the upper surface of the green curved structure 500G. For example, the lower surface and the upper surface of the lower electrode 310 formed on the green pixel area GPA may have a same curvature as the upper surface of the green curved structure 500G. The lower electrode 310 of the blue pixel area BPA may be in direct contact with the upper surface of the blue curved structure 500B. A lower surface and an upper surface of the lower electrode 310 formed on the blue pixel area BPA may have a curvature corresponding to the upper surface of the blue curved structure 500B. For example, the lower surface and the upper surface of the lower electrode 310 formed on the blue pixel area BPA may have a same curvature as the upper surface of the blue curved structure 500B. A curvature of the lower electrode 310 formed on the green pixel area GPA may be between a curvature of the lower electrode 310 formed on the red pixel area RPA and a curvature of the lower electrode 310 formed on the blue pixel area BPA.

Figure 12:
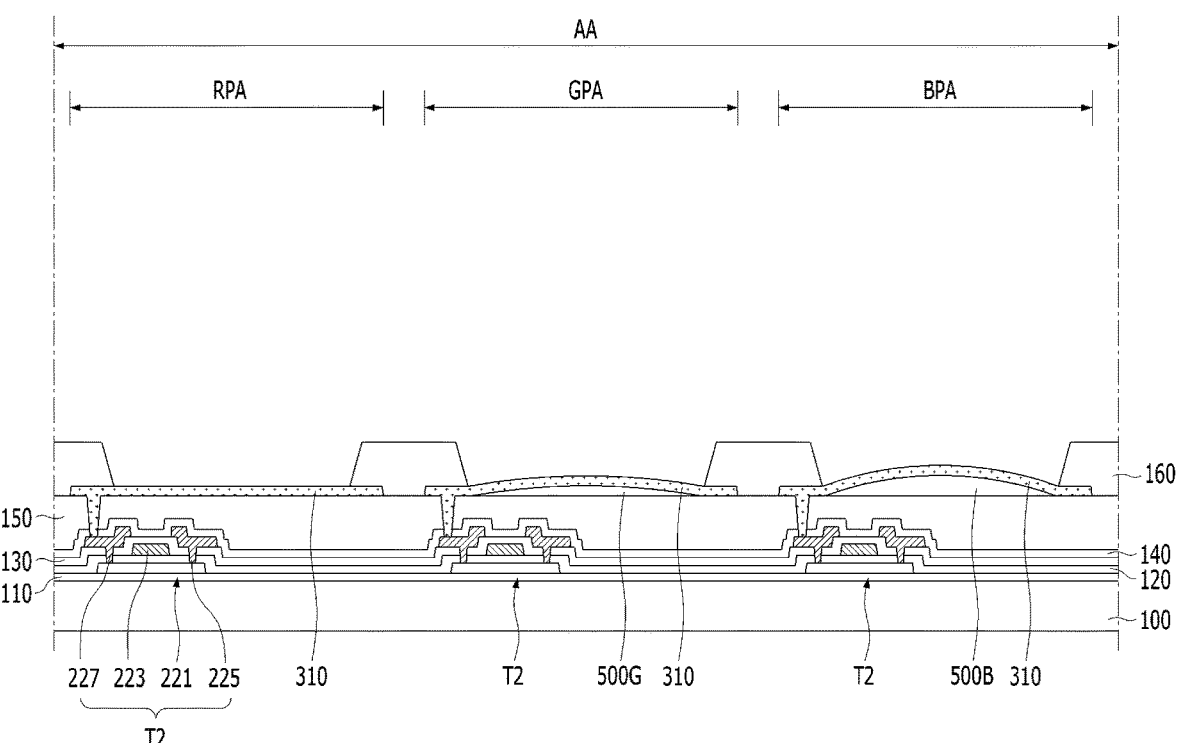

The method of forming the display apparatus according to the aspect of the present disclosure may include a step of forming a bank insulating layer 160 between the lower electrodes 310, as shown in FIG. 12.

The bank insulating layer 160 may cover an edge of the lower electrode 310 in each pixel area RPA, GPA and BPA. The bank insulating layer 160 may be formed outside the green curved structure 500G and the blue curved structure 500B. For example, an end of the lower electrode 310 formed on the green pixel area GPA may be disposed outside the green curved structure 500G, and an end of the lower electrode 310 formed on the blue pixel area BPA may be disposed outside the blue curved structure 500B.

Figure 13:
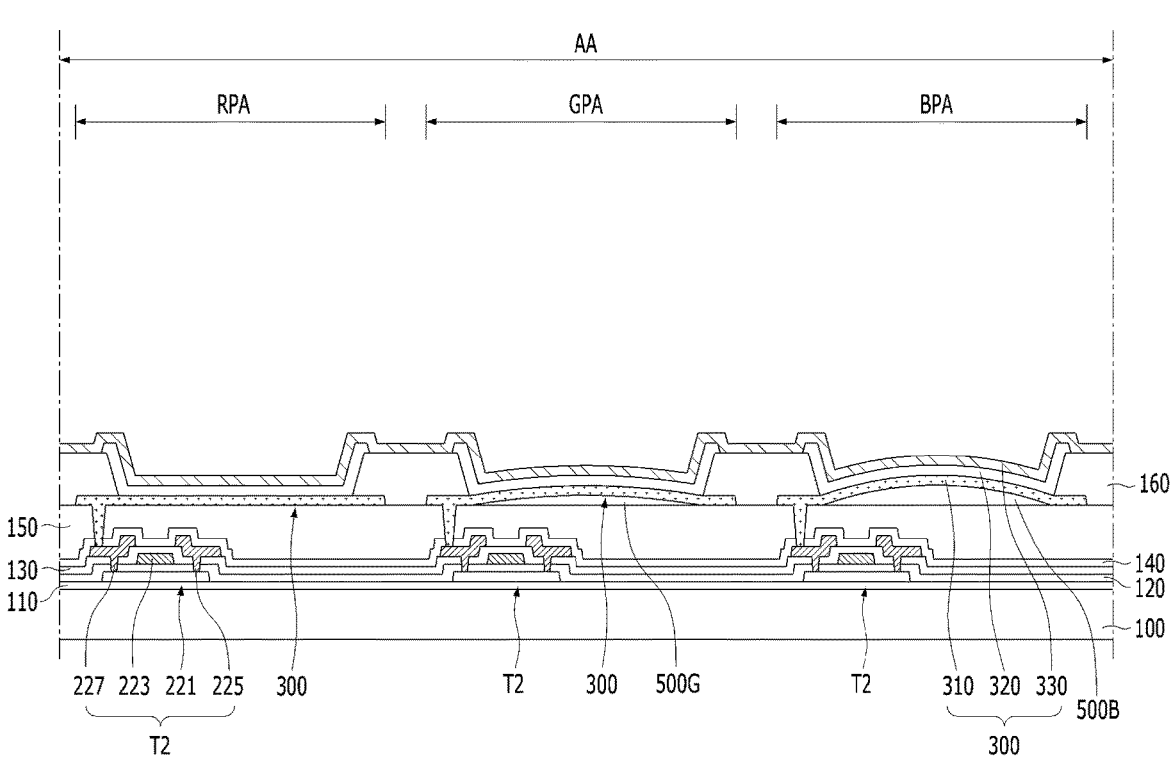

The method of forming the display apparatus according to the aspect of the present disclosure may include a step of forming a light-emitting layer 320 on the lower electrode 310 of each pixel area RPA, GPA and BPA, and a step of forming an upper electrode 330 on the light-emitting layer 320 of each pixel area RPA, GPA and BPA, as shown in FIG. 13.

The light-emitting layer 320 of the red pixel area RPA, the light-emitting layer 320 of the green pixel area GPA and the light-emitting layer 320 of the blue pixel area BPA may be formed of different material from each other. The light-emitting layer 320 of the red pixel area RPA, the light-emitting layer 320 of the green pixel area GPA and the light-emitting layer 320 of the blue pixel area BPA may be formed to have different thickness from each other. For example, a step of forming the light-emitting layer 320 on the lower electrode 310 of each pixel area RPA, GPA and BPA may include a step of forming the light-emitting layer 320 on the lower electrode 310 of the red pixel area RPA, a step of forming the light-emitting layer 320 on the lower electrode 310 of the green pixel area GPA, and a step of forming the light-emitting layer 320 on the lower electrode 310 of the blue pixel area BPA. Thus, in the method of forming the display apparatus according to the aspect of the present disclosure, each of the pixel areas RPA, GPA and BPA may use a micro-cavity effect. Therefore, in the method of forming the display apparatus according to the aspect of the present disclosure, the light-extraction efficiency may be effectively improved.

The upper electrode 330 of the red pixel area RPA may be formed of a same material as the upper electrode 330 of the green pixel area GPA and the upper electrode 330 of the blue pixel area BPA. The upper electrode 330 of the red pixel area RPA may be formed to have a same thickness as the upper electrode 330 of the green pixel area GPA and the upper electrode 330 of the blue pixel area BPA. For example, the upper electrode 330 of the red pixel area RPA may be formed simultaneously with the upper electrode 330 of the green pixel area GPA and the upper electrode 330 of the blue pixel area BPA. Thus, in the method of forming the display apparatus according to the aspect of the present disclosure, a process of forming the upper electrode 330 on each pixel area RPA, GPA and BPA may be simplified. The bank insulating layer 160 may be covered by the upper electrode 330. The lower electrode 310, the light-emitting layer 320 and the upper electrode 330 stacked on each pixel area RPA, GPA and BPA may configure a light-emitting device 300 of the corresponding pixel area RPA, GPA and BPA.

The method of forming the display apparatus according to the aspect of the present disclosure may include a step of forming an encapsulation unit 400 on the light-emitting device 300 of each pixel area RPA, GPA and BPA, as shown in FIG. 3.

The encapsulation unit 400 may include a first encapsulating layer 410, a second encapsulating layer 420 and a third encapsulating layer 430, which are sequentially stacked. For example, the step of forming the encapsulation unit 400 may include a step of forming a first encapsulating layer 410 on the light-emitting layer 300 of each pixel area RPA, GPA and BPA, a step of forming a second encapsulating layer 420 on the first encapsulating layer 410, and a step of forming a third encapsulating layer 430 on the second encapsulating layer 420.

Accordingly, in the method of forming the display apparatus according to the aspect of the present disclosure, the blue curved structure 500B between the planarization layer 150 and the lower electrode 310 of the blue pixel area BPA may be formed simultaneously with the green curved structure 500G between the planarization layer 150 and the lower electrode 310 of the green pixel area GPA. Thus, in the method of forming the display apparatus according to the aspect of the present disclosure, the process efficiency may be improved. That is, in the method of forming the display apparatus according to the aspect of the present disclosure, the deviation in an amount of luminance change according to a viewing angle may be reduced, without minimizing additional process. Therefore, in the method of forming the display apparatus according to the aspect of the present disclosure, change in color sense and deterioration in quality of the image according to the viewing angle may be effectively reduced. And, in the method of forming the display apparatus according to the aspect of the present disclosure, production energy may be reduced by process optimization.

Figure 14:
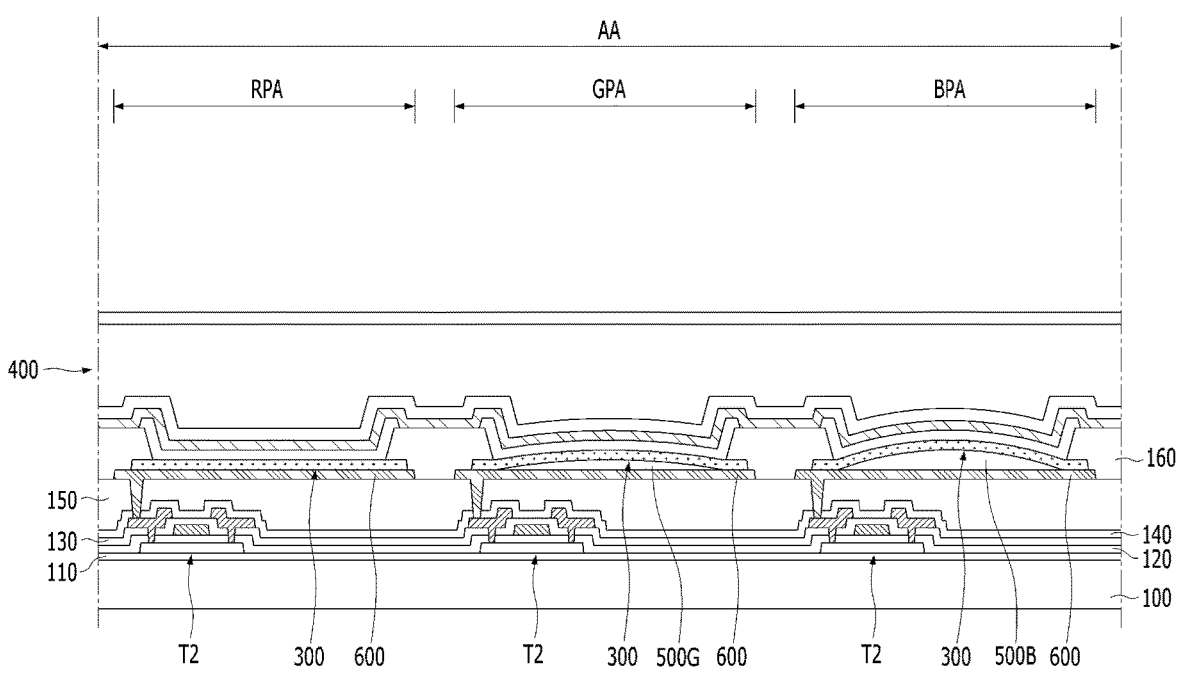

The display apparatus according to the aspect of the present disclosure and the method of forming the same are described that the lower electrode 310 of the red pixel area RPA, the lower electrode 310 of the green pixel area GPA and the lower electrode 310 of the blue pixel area BPA are in direct contact with the second source electrode 227 of the second thin film transistor T2 in the corresponding pixel area RPA, GPA and BPA, respectively. However, in the display apparatus according to another aspect of the present disclosure, the lower electrode 310 of the red pixel area RPA, the lower electrode 310 of the green pixel area GPA and the lower electrode 310 of the blue pixel area BPA may be electrically connected to the corresponding pixel driving circuit DC through a conductive pattern disposed in the corresponding pixel area RPA, GPA and BPA, respectively. For example, the display apparatus according to another aspect of the present disclosure may include pixel electrodes 600 on the planarization layer 150 of each pixel area RPA, GPA and BPA, as shown in FIG. 14. Each of the pixel electrodes 600 may be disposed between the planarization layer 150 and the lower electrode 310 of the red pixel area RPA, between the planarization layer 150 and the green curved structure 500G of the green pixel area GPA, or between the planarization layer 150 and the blue curved structure 500B of the blue pixel area BPA.

The lower electrode 310 of the red pixel area RPA may be electrically connected to the second thin film transistor T2 in the red pixel area RPA through one of the pixel electrodes 600. For example, the pixel electrode 600 of the red pixel area RPA may be disposed between the planarization layer 150 and the lower electrode 310 of the red pixel area RPA. The pixel electrode 600 of the red pixel area RPA may be in direct contact with the lower surface of the lower electrode 310 and the upper surface of the planarization layer 150, which are disposed in the red pixel area RPA.

The lower electrode 310 of the green pixel area GPA may be electrically connected to the second thin film transistor T2 in the green pixel area GPA through one of the pixel electrodes 600. The pixel electrode 600 of the green pixel area GPA may include a same material as the pixel electrode 600 of the red pixel area RPA. The pixel electrode 600 of the green pixel area GPA may have a same thickness as the pixel electrode 600 of the red pixel area RPA. For example, the pixel electrode 600 of the green pixel area GPA may be formed simultaneously with the pixel electrode 600 of the red pixel area RPA. The green curved structure 500G may be disposed on the pixel electrode 600 of the green pixel area GPA. For example, the pixel electrode 600 of the green pixel area GPA may be disposed between the planarization layer 150 and the green curved structure 500G of the green pixel area GPA. The lower electrode 310 of the green pixel area GPA may be in direct contact with the pixel electrode 600 of the green pixel area GPA outside the green curved structure 500G.

The lower electrode 310 of the blue pixel area BPA may be electrically connected to the second thin film transistor T2 in the blue pixel area BPA through one of the pixel electrodes 600. The pixel electrode 600 of the blue pixel area BPA may include a same material as the pixel electrode 600 of the green pixel area GPA. The pixel electrode 600 of the blue pixel area BPA may have a same thickness as the pixel electrode 600 of the green pixel area GPA. For example, the pixel electrode 600 of the blue pixel area BPA may be formed simultaneously with the pixel electrode 600 of the green pixel area GPA. The blue curved structure 500B may be disposed on the pixel electrode 600 of the blue pixel area BPA. For example, the pixel electrode 600 of the blue pixel area BPA may be disposed between the planarization layer 150 and the blue curved structure 500B of the blue pixel area BPA. The lower electrode 310 of the blue pixel area BPA may be in direct contact with the pixel electrode 600 of the blue pixel area BPA outside the blue curved structure 500B.

The pixel electrodes 600 may include a conductive material. The pixel electrodes 600 may include a metal, such as aluminum (Al), chrome (Cr), copper (Cu), molybdenum (Mo), titanium (Ti) and tungsten (W). Thus, in the display apparatus according to another aspect of the present disclosure, the light-emitting device 300 of each pixel area RPA, GPA and BPA may be stably connected to the pixel driving circuit of the corresponding pixel area RPA, GPA and BPA. Therefore, in the display apparatus according to another aspect of the present disclosure, the deterioration in the quality of the image according to the viewing angle may be effectively improved.

The display apparatus according to the aspect of the present disclosure and the method of forming the same are described that the lower electrode 310 of the red pixel area RPA is in direct contact with the planarization layer 150. However, in the display apparatus according to another aspect of the present disclosure, a red curved structure 500R may be disposed between the planarization layer 150 and the lower electrode 310 of the red pixel area RPA. A lower surface of the red curved structure 500R toward the device substrate 100 may be in direct contact with the upper surface of the planarization layer 150. An upper surface of the red curved structure 500R opposite to the device substrate 100 may have a curvature different from the upper surface of the green curved structure 500G and the upper surface of the blue curved structure 500B. For example, the upper surface of the red curved structure 500R opposite to the device substrate 100 may have a curvature between the upper surface of the green curved structure 500G and the upper surface of the blue curved structure 500B. Thus, in the display apparatus according to another aspect of the present disclosure, change in color sense and color coordinates of the realized image according to the viewing angle may be effectively improved.

In the display apparatus according to another aspect of the present disclosure, the red curved structure 500R, the green curved structure 500G and the blue curved structure 500B may be formed of a conductive material. For example, in the display apparatus according to another aspect of the present disclosure, the red curved structure 500R, the green curved structure 500G and the blue curved structure 500B may be formed of a metal having high reflectance, such as aluminum (Al) and silver (Ag). Thus, in the display apparatus according to another aspect of the present disclosure, the red curved structure 500R, the green curved structure 500G and the blue curved structure 500B may function as a reflective electrode. That is, in the display apparatus according to another aspect of the present disclosure, the lower electrode 310 of each pixel area RPA, GPA and BPA may be formed of a transparent conductive material. For example, in the display apparatus according to another aspect of the present disclosure, the lower electrode 310 of each pixel area RPA, GPA and BPA may be a transparent electrode. Therefore, in the display apparatus according to another aspect of the present disclosure, the degree of freedom for a material of the lower electrode 310 formed in each pixel area RPA, GPA and BPA may be improved.

In the result, the display apparatus according to the aspects of the present disclosure may comprise a first light-emitting device on a first pixel area of a device substrate, and a second light-emitting device on a second pixel area of the device substrate, wherein a second lower electrode of the second light-emitting device may have a curvature different from a first lower electrode of the first light-emitting device. Thus, in the display apparatus according to the aspects of the present disclosure, the deviation in an amount of luminance change according to a viewing angle of light emitted from light-emitting devices of pixel areas realizing various colors may be reduced, and change in color sense of image according to the viewing angle may be minimized. And, in the display apparatus according to the aspects of the present disclosure, asymmetry of the image according to an azimuth may be improved. Thereby, in the display apparatus according to the aspects of the present disclosure, the production energy may be reduced by process optimization.

It will be apparent to those skilled in the art that various modifications and variations can be made in the display apparatus having pixel areas displaying different colors of the present disclosure without departing from the spirit or scope of the aspects. Thus, it is intended that the present disclosure covers the modifications and variations of the aspects provided they come within the scope of the appended claims and their equivalents.

What is claimed is:

1. A display apparatus comprising:
   a planarization layer disposed on a first pixel area and a second pixel area of a device substrate;
   a first light-emitting device disposed on the planarization layer of the first pixel area, the first light-emitting device having a stacked structure of a first lower electrode, a first light-emitting layer and a first upper electrode; and
   a second light-emitting device disposed on the planarization layer of the second pixel area, the second light-emitting device having a stacked structure of a second lower electrode, a second light-emitting layer and a second upper electrode,
   wherein the second pixel area realizes a color different from the first pixel area, and
   wherein an upper surface of the second lower electrode toward the second light-emitting layer has a curvature different from an upper surface of the first lower electrode toward the first light-emitting layer.

2. The display apparatus according to claim 1, wherein the second lower electrode has a same thickness as the first lower electrode.

3. The display apparatus according to claim 1, further comprising:
   a first curved structure disposed between the planarization layer and the first lower electrode; and
   a second curved structure disposed between the planarization layer and the second lower electrode,
   wherein the upper surface of the first lower electrode has a curvature corresponding to an upper surface of the first curved structure toward the first lower electrode, and
   wherein the upper surface of the second lower electrode has a curvature corresponding to an upper surface of the second curved structure toward the second lower electrode.

4. The display apparatus according to claim 3, wherein each of the first curved structure and the second curved structure includes a lower surface toward the device substrate, and
   wherein the lower surface of the first curved structure and the lower surface of the second curved structure are in contact with an upper surface of the planarization layer opposite to the device substrate.

5. The display apparatus according to claim 3, wherein the first curved structure and the second curved structure include metal.

6. The display apparatus according to claim 5, wherein the first curved structure and the second curved structure have a reflectance higher than the first lower electrode and the second lower electrode.

7. The display apparatus according to claim 3, further comprising a third light-emitting device disposed on the planarization layer, the third light-emitting device overlapping with a third pixel area of the device substrate, wherein the third light-emitting device has a stacked structure of a third lower electrode, a third light-emitting layer and a third upper electrode, wherein the third pixel area realizes a color different from the first pixel area and the second pixel area, and wherein an upper surface of the third lower electrode toward the third light-emitting layer has a curvature different from the upper surface of the first lower electrode and the upper surface of the second lower electrode.

8. The display apparatus according to claim 7, wherein a lower surface of the third lower electrode toward the device substrate is in contact with an upper surface of the planarization layer opposite to the device substrate.

9. A display comprising:

a device substrate including a first pixel area and a second pixel area realizing a color different from the first pixel area;

a first curved structure disposed on the first pixel area of the device substrate, an upper surface of the first curved structure having a first curvature;

a first light-emitting device disposed on the upper surface of the first curved structure, the first light-emitting device having a stacked structure of a first lower electrode, a first light-emitting layer and a first upper electrode;

a second curved structure disposed on the second pixel area of the device substrate, an upper surface of the second curved structure having a second curvature different from the first curvature; and a second light-emitting device disposed on the upper surface of the second curved structure, the second light-emitting device having a stacked structure of a second lower electrode, a second light-emitting layer and a second upper electrode, wherein the first lower electrode, the first light-emitting layer and the first upper electrode have the first curvature, and wherein the second lower electrode, the second light-emitting layer and the second upper electrode have the second curvature.

10. The display apparatus according to claim 9, wherein the second lower electrode has a same thickness as the first lower electrode, and wherein the second upper electrode has a same thickness as the first upper electrode.

11. The display apparatus according to claim 9, wherein the first curved structure and the second curved structure include an insulating material.

12. The display apparatus according to claim 11, wherein the second curved structure includes a same material as the first curved structure.

13. The display apparatus according to claim 11, further comprising:

a first pixel electrode disposed between the device substrate and the first curved structure, the first pixel electrode electrically connected to the first lower electrode; and a second pixel electrode disposed between the device substrate and the second curved structure, the second pixel electrode electrically connected to the second lower electrode, wherein an upper surface of the second pixel electrode toward the second curved structure is parallel to an upper surface of the first pixel electrode toward the first curved structure.

14. The display apparatus according to claim 13, wherein the second pixel electrode includes a same material as the first pixel electrode.

15. The display apparatus according to claim 13, wherein the second pixel electrode has a same thickness as the first pixel electrode.

\* \* \* \* \*